(12) United States Patent
Wang

(10) Patent No.: US 7,995,398 B2
(45) Date of Patent: Aug. 9, 2011

(54) STRUCTURES AND METHODS FOR READING OUT NON-VOLATILE MEMORIES

(75) Inventor: Lee Wang, Diamond Bar, CA (US)

(73) Assignee: FlashSilicon, Inc., Diamond Bar, CA (US)

( * ) Notice: Subject to any disclaimer, the term of this patent is extended or adjusted under 35 U.S.C. 154(b) by 92 days.

(21) Appl. No.: 12/614,280

(22) Filed: Nov. 6, 2009

(65) Prior Publication Data
US 2011/0110162 A1    May 12, 2011

(51) Int. Cl.
*G11C 16/26*    (2006.01)
(52) U.S. Cl. ............... 365/185.21; 365/185.25; 365/229
(58) Field of Classification Search .................... 365/104
See application file for complete search history.

(56) References Cited

U.S. PATENT DOCUMENTS 5,532,623 A * 7/1996 Advani et al. .................. 327/51
7,551,490 B2 * 6/2009 Kim ......................... 365/185.25

* cited by examiner

*Primary Examiner* — Tan T. Nguyen
(74) *Attorney, Agent, or Firm* — Edward C. Kwok; Haynes and Boone, LLP

(57) ABSTRACT

Non-differential sense amplifier circuitry for reading out Non-Volatile Memories (NVMs) and its operating methods are disclosed. Such non-differential amplifier circuitry requires exceptionally low power and achieves moderate sensing speed, as compared to a conventional sensing scheme.

24 Claims, 10 Drawing Sheets

STRUCTURES AND METHODS FOR READING OUT NON-VOLATILE MEMORIES

BACKGROUND OF THE INVENTION

1. Field of the Invention

The present invention relates to an integrated circuit for sensing stored information of a non-volatile memory (NVM). In particular, the present invention relates to circuitry and operating method that are applied to sense information stored on NVM devices (e.g., electrically erasable programmable read-only memory (EEPROM), read only memories (ROMs), phase-change memories (PCMs), and magneto-resistive random memories (MRAMs)).

2. Discussion of the Related Art

In an integrated memory circuit, a readout circuitry detects and determines the content stored in a selected NVM cell. In many NVM cells, the stored information is represented by one of several possible values of its electrical conductance characteristics. The selected values are kept even after the NVM device's power is withdrawn or cut off. For instances, an EEPROM cell can represent its stored information by adopting in a metal-oxide-semiconductor field effect transistor (MOSFET) one of several threshold voltages. The selected threshold voltage is achieved by storing a known amount of charge in between the MOSFET's control gate and its channel. A ROM cell can represent a binary stored value by having a connection or not having a connection between a MOSFET and a bit line. A PCM represents a binary stored value by being in either a high electrical conductance state or a low electrical conductance state, according to whether a silicon layer in the device is in an amorphous phase or a polycrystalline phase. Basically, the stored information in an NVM cell can be determined by measuring an electrical conductance in the NVM cell, and by requiring that the conductance characteristics remain even after power is turned off.

Therefore, one way to read out the stored data in a selected NVM cell is to apply a bias voltage to the NVM cell and measure the resulting current. In a conventional readout scheme, e.g., using readout circuit 100 of FIG. 1, cell current from NVM cell 102 responsive to the input bias voltage on word line 101 is pre-amplified at current amplifier 103 and compared with a reference current generated by reference current generation circuit 104. The two currents may be compared using differential amplifier comparator 105. The output value of comparator 105 represents either a high NVM electrical conductance, corresponding to detecting a large resulting current, and a low NVM electrical conductance, corresponding to detecting a low resulting current. In this readout process, large steady output currents are supplied from the memory cells (e.g., NVM memory cell 102) being in a high electrical conductance state, pre-amplifier 103, differential amplifier comparator 105, and reference current circuitry 104. Large steady currents lead to a high power requirement for reading out the stored information from the NVM cell.

SUMMARY

According to one embodiment of the present invention, readout circuitry and operating methods thereof eliminate the requirement for a large steady current during both sensing and standby modes of operation, thus achieving low power consumption during reading out of NVM data. In one embodiment, readout circuitry of the present invention does not require a reference current or voltage. Thus, circuit complexity inherent in generating a reference current is avoided.

According to another embodiment of the present invention, a non-differential type readout circuitry avoids the offset caused by device mismatch.

The present invention is better understood upon consideration of the detailed description below, in conjunction with the drawings.

BRIEF DESCRIPTION OF THE DRAWINGS

For a better understanding of the present invention and to show how it may be carried into effect, reference is now made to the following drawings, which show the preferred embodiments of the present invention, in which.

DETAILED DESCRIPTION OF THE PREFERRED EMBODIMENT

Figure 1:
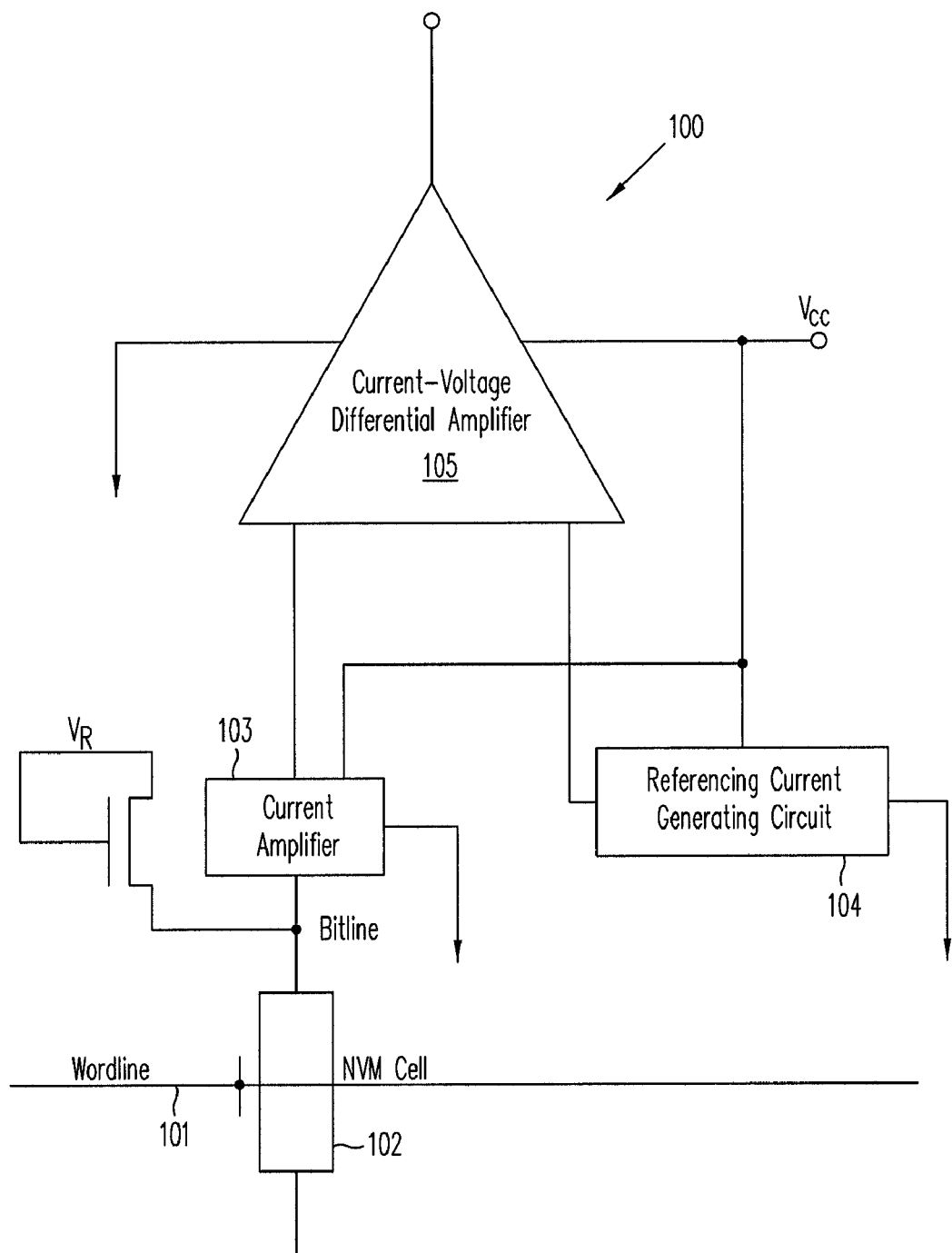
FIG. 1 shows a prior art NVM cell readout circuit 100.
Figure 2:
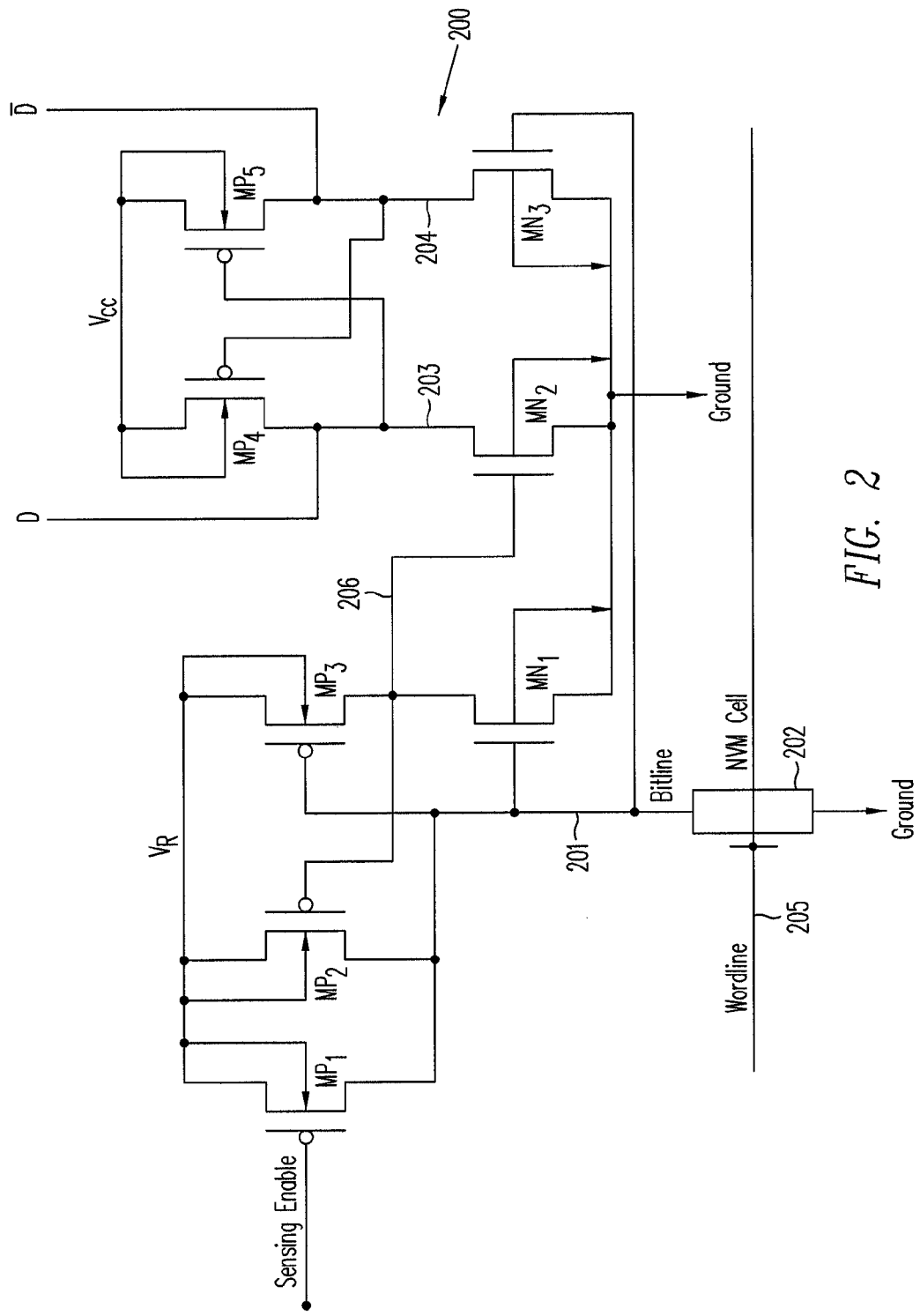
FIG. 2 shows readout circuit 200, in accordance with one embodiment of the present invention.
Figure 3:
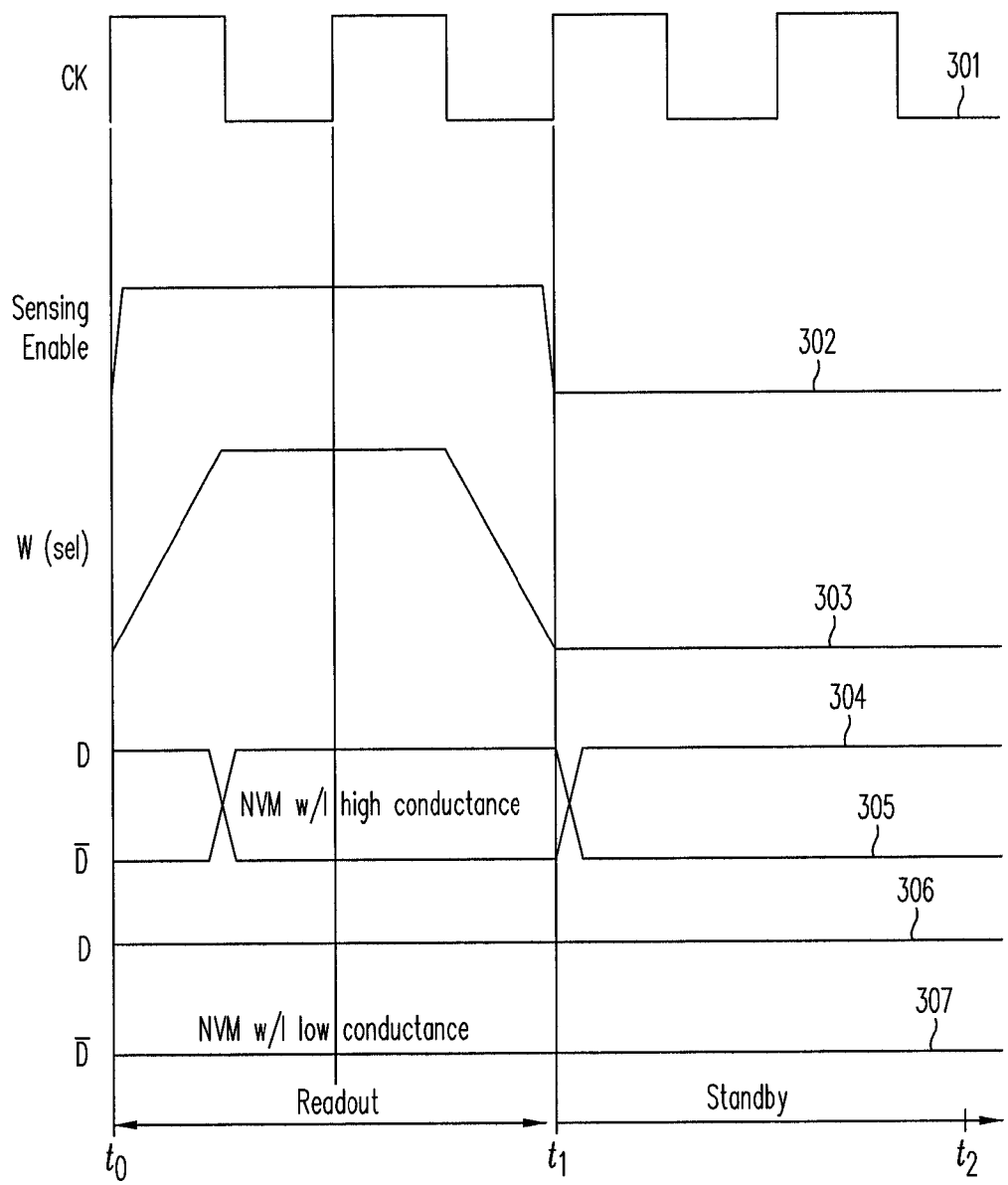
FIG. 3 illustrates the operations of readout circuitry 200 of FIG. 2, in accordance with one embodiment of the present invention.

FIGS. 2 and 3 show, respectively, readout circuit 200 and its operations, in accordance with one embodiment of the present invention. As shown in FIG. 2, the source electrode and the drain electrode of P-type MOSFET $MP_1$ are connected to read voltage bias $V_R$ and to bit line 201 connected to NVM cell 202, which stored information is to be read. When readout circuit 200 is in a standby mode (i.e., between times $t_1$ and $t_2$ in FIG. 3), signal "Sense Enable" (i.e., waveform 302 of FIG. 3), which is applied to the gate electrode of $MP_1$, is at zero volts, so that bit line 201 is pulled ("pre-charged") to read voltage bias $V_R$. In standby mode, the NVM cells connected to bit line 201 are not selected (i.e., word line 205 is at a "low" state; see, waveform 303 of FIG. 3), and thus are not activated. Consequently, the electrical conductance of NVM cell 202 is low. No active steady current path exists for a current to flow from read voltage bias $V_R$ to the ground reference through an NVM cell attached to bit line 201. The voltage $V_R$ on bit line 201 turns on NMOS transistor $MN_3$, which pulls node 204 (signal $\overline{D}$, waveform 307) to the ground reference, thus rendering PMOS transistor $MP_4$ conducting, pulling node 203 (signal "D," waveform 306) to core "high" voltage $V_{CC}$. As a result, complementary data output terminals 203 and 204

(signals "D" and "D̄" of read circuit 200, respectively) are set to "high" and "low" states ("default states").

In reading mode (i.e., between times $t_0$ and $t_1$ of FIG. 3), the voltage at the gate terminal of PMOS transistor $MP_1$ (i.e., signal "Sense Enable," waveform 302 of FIG. 3) is brought to a "high" level (e.g., core high voltage $V_{CC}$), thus turning off PMOS transistor $MP_1$. When word line 205 is selected (waveform 203 of FIG. 3), the gate electrodes of a "row" of NVM cells (e.g., NVM cell 202) are activated, so that their respective electrical conductance values may be probed. The NVM cells with high conductance begin to discharge their corresponding bit lines (representing the stored values in the high conductance NVM cells) from voltage $V_R$ to the ground reference. Discharging bit line 201 leads to a voltage drop at the gate terminals of PMOS transistor $MP_3$ and NMOS transistor $MN_1$. The voltage at node 206 begins to rise which reduces the current in PMOS transistor $MP_2$ and increases the rate of discharge at bit line 201 (i.e., a positive feedback action). With the positive feedback action of PMOS transistor $MP_3$ and NMOS transistor $MN_1$, PMOS transistor $MP_2$ is rapidly turned off, thus isolating bit line 201 from read voltage bias $V_R$. Bit line 201 continues to discharge through NVM cell 202 until its voltage reaches ground reference (and node 206 reaches read voltage bias $V_R$). Conducting NMOS transistor $MN_2$ turns on PMOS transistor $MP_5$. At the same time, NMOS transistor $MN_3$, which is shut off, turns off PMOS transistor $MP_4$. Thus, PMOS transistors $MP_4$ and $MP_5$, and NMOS transistors $MN_2$, and $MN_3$ operate to convert the voltage on bit line 201 (which switches from a "high" voltage state to a "low" voltage state) to "low" and "high" voltage states on data output terminals 203 and 204 (i.e., signals "D" and "D̄" of read circuit 200, respectively), from their default "high" and "low" voltage states. See, waveforms 304 and 305 of FIG. 3. No steady current flows after read circuitry 200 reaches the steady state. The only currents generated during the read process are the transient currents from discharging bit lines and MOSFET switching in the circuitry. As mentioned above, in this detailed description, the "high" voltage state corresponds to the core voltage $V_{CC}$ level and the "low" voltage corresponds to the ground reference.

During the reading mode, for a selected NVM cell that has a low electrical conductance, the voltage on the associated bit line remains at $V_R$, as only very small leakage current flows through the selected NVM cell (e.g., bit line 201). The small leakage current is unable to discharge bit line 201 and affects the default states of data output terminals 203 and 204 (i.e., signals D and D̄ are at "high" and "low" states, respectively).

At time $t_1$, the voltage at the gate terminal of PMOS transistor $MP_1$ is set to "low" state (i.e., 0 volt) and PMOS transistor $MP_1$ begins to recharge the bit lines (e.g., bit line 201). The data output terminals 203 and 204 of read circuit 200 return to the default states (i.e., "high" and "low" voltage states for signals D and D̄, respectively; see waveforms 304, 305, 306 and 307). Recharged, read circuit 200 is ready for the next read operation.

Thus, the present invention provides a read circuit that achieves low-power reading out of an NVM cell.

Figure 4:
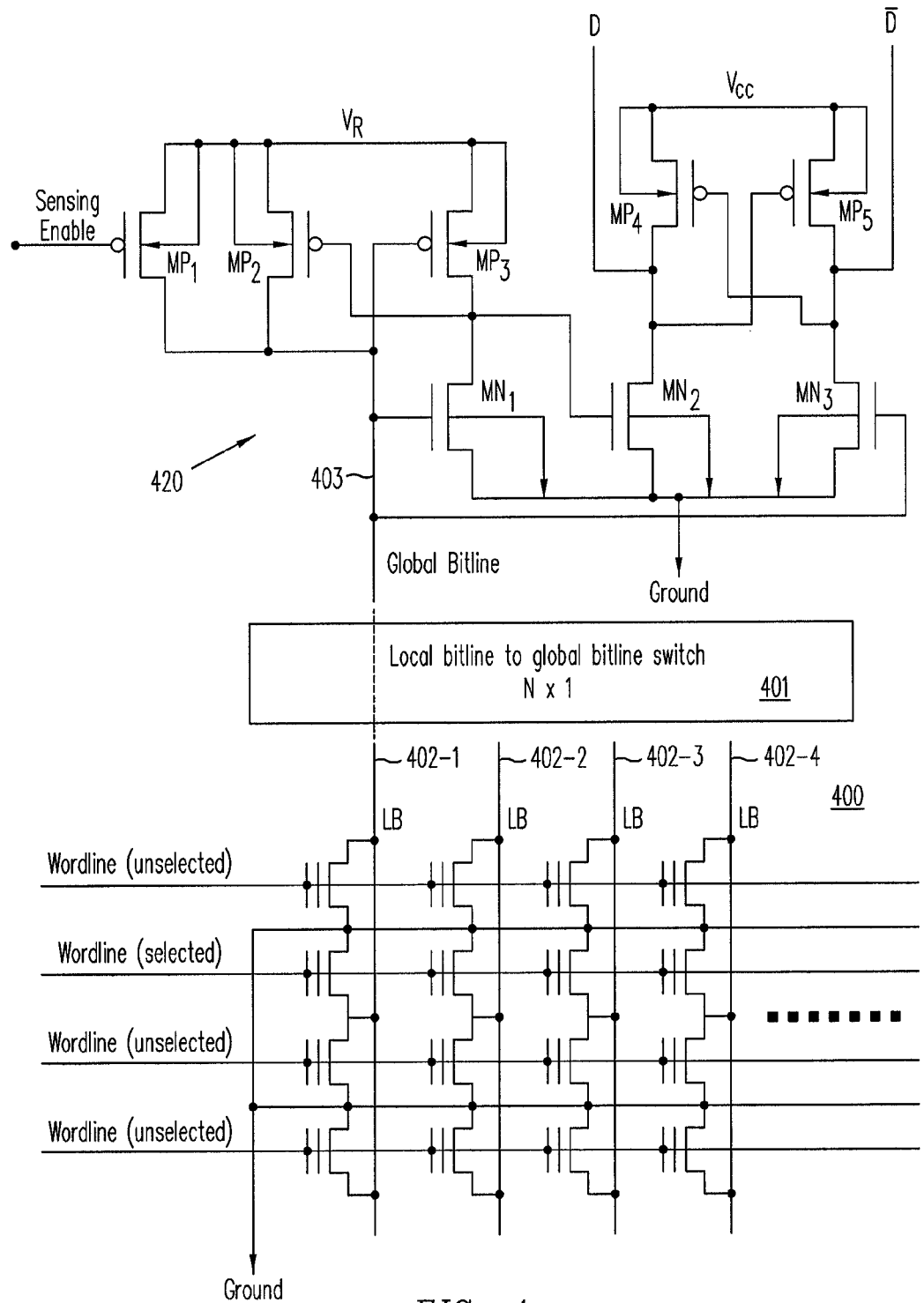
FIG. 4 shows a circuit schematic for a NOR-type flash EEPROM array 400, in accordance with one embodiment of the present invention.
Figure 5:
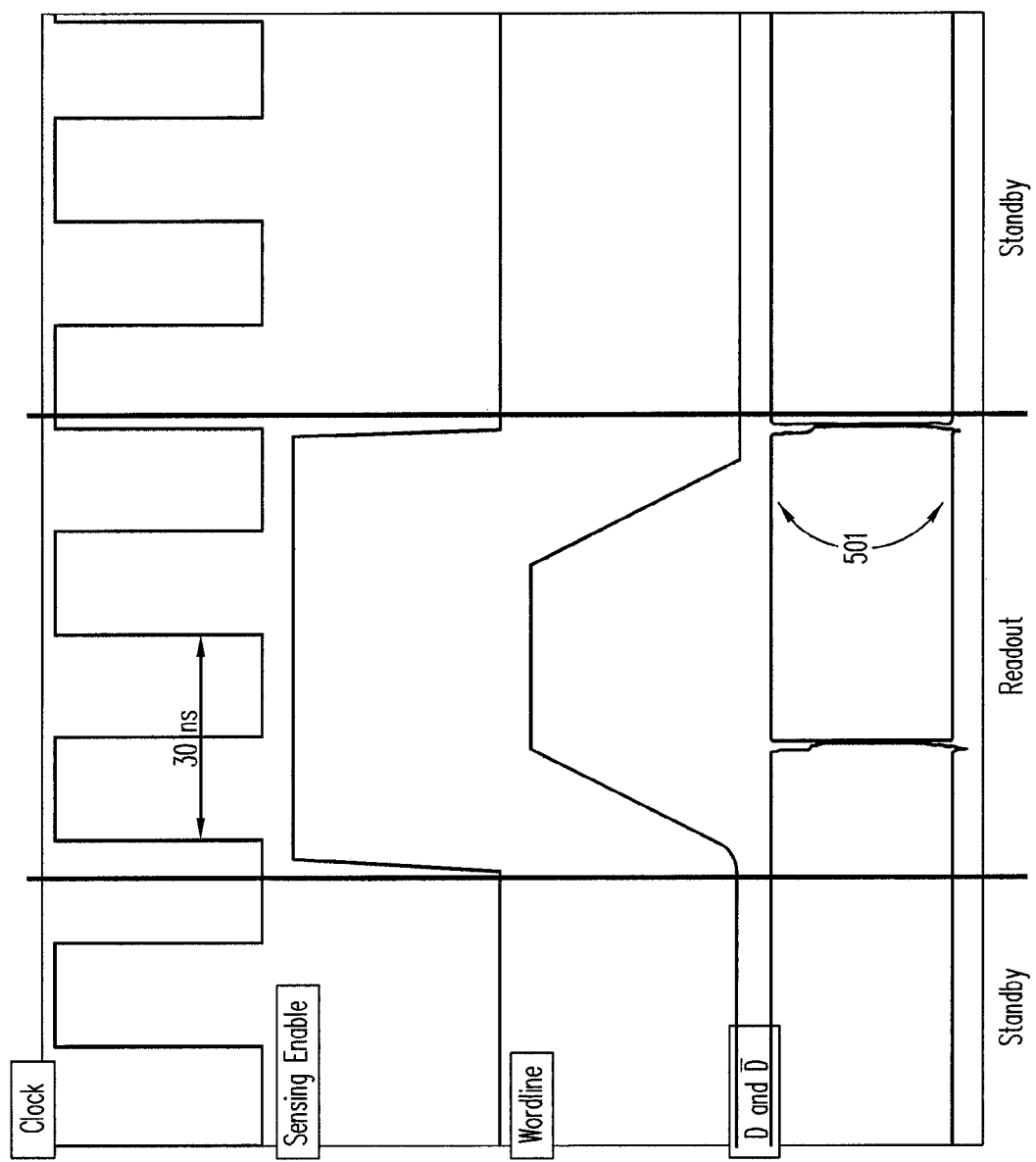
FIG. 5 show simulation results that illustrate the operations of readout circuitry 420 included in the NOR-type flash EEPROM array 400 of FIG. 4, in accordance with one embodiment of the present invention.

FIG. 4 shows circuit schematic for a NOR-type flash EEPROM array 400, in accordance with one embodiment of the present invention. FIG. 5 show simulation results that illustrate the operations of readout circuitry 420 included in the NOR-type flash EEPROM array 400 of FIG. 4, in accordance with one embodiment of the present invention. As shown in FIG. 4, flash EEPROM array 400 includes an array of flash EEPROM cells, selected by word lines, each word line activating a row of the flash EEPROM cells at a time. Each activated EEPROM cell provides its content on one of local bit lines 402-1 to 402-N. Switch structure 401 connects one of the local bit lines 401-1 to 401-N to a global bit line 403, which is read by readout circuit 420. Readout circuit 420 operates in substantially the same manner as read out circuit 200 discussed above. In flash EEPROM array 400, a high conductance EEPROM cell has a low threshold voltage, and a low conductance EEPROM cell has a high threshold voltage. A suitable process for fabricating flash EEPROM array 400 is a 0.13 μm process. As shown in FIG. 5, during the read out period, output data signals D and D̄ settles at its final signal values for those EEPROM cells with low threshold voltage (i.e., high electrical conductance) within several nanoseconds (see waveforms 501 in FIG. 5).

Figure 6:
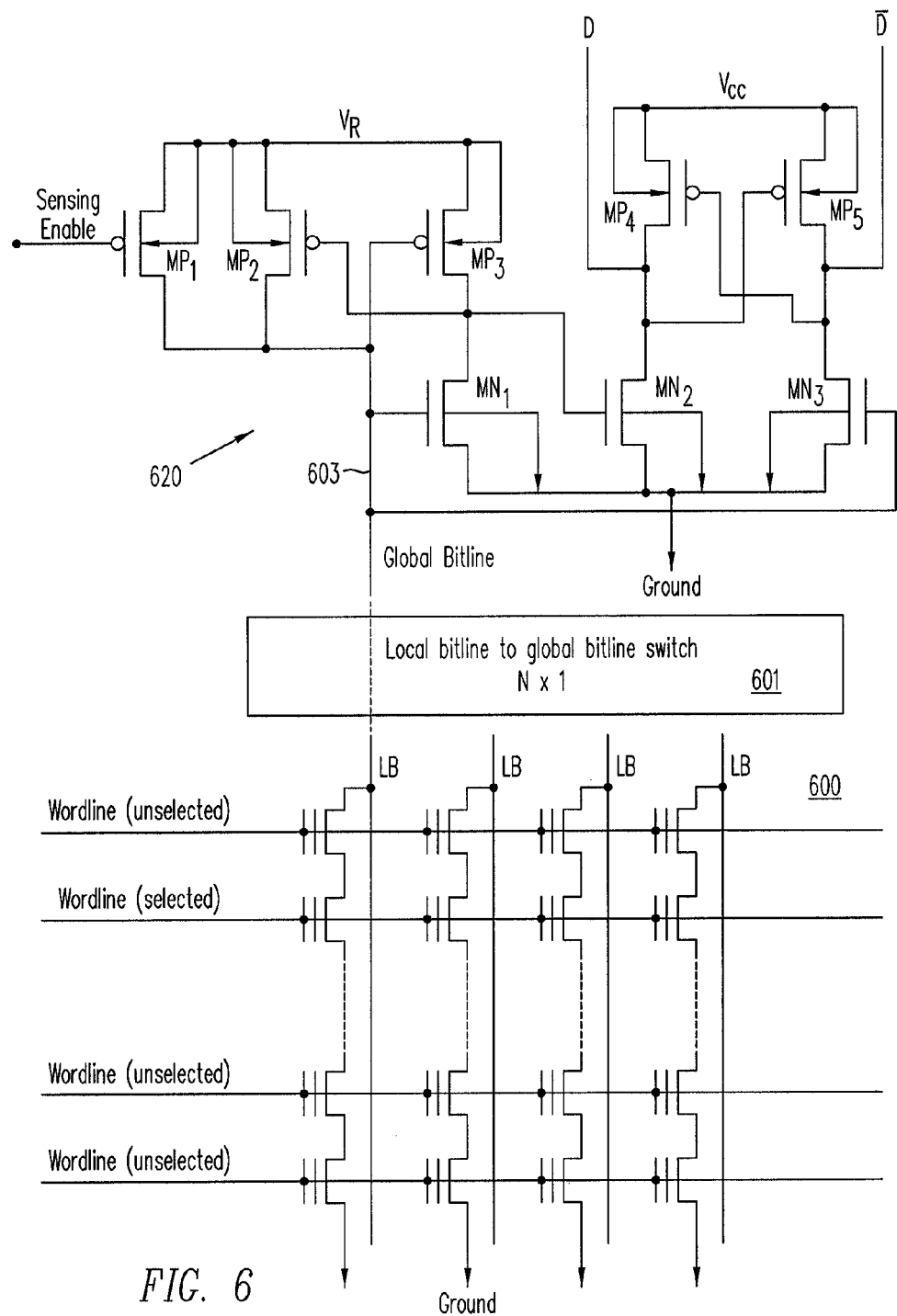
FIG. 6 shows circuit schematic for a NAND-type flash EEPROM array 600, in accordance with one embodiment of the present invention.

FIG. 6 shows circuit schematic for a NAND-type flash EEPROM array 600, in accordance with one embodiment of the present invention. As shown in FIG. 6, flash EEPROM array 600 includes an array of EEPROM cells, selected by word lines, each word line activating a row of EEPROM cells at a time. The EEPROM cells are also organized in columns as memory strings, with each memory string including a number of serially connected EEPROM cells served by one of local bit lines 602-1 to 602-N. Each selected EEPROM cell controls the discharge of the corresponding one of local bit lines 602-1 to 602-N to ground through NVM cells in its memory string. The unselected EEPROM cells are each biased to a high voltage to pass the bit line voltage and the ground voltage, respectively, to the drain terminal and the source terminal of the selected EEPROM cell. Therefore, if the selected EEPROM is high conductance (i.e., low threshold voltage), that EEPROM cell discharges its associated bit line. Conversely, if the selected EEPROM is low conductance (i.e., high threshold voltage), that EEPROM cell does not discharge its associated bit line. Switch structure 601 connects one of the local bit lines 601-1 to 601-N to a global bit line 603, which is read by readout circuit 620. Readout circuit 620 operates in substantially the same manner as read out circuit 200 discussed above.

Figure 7:
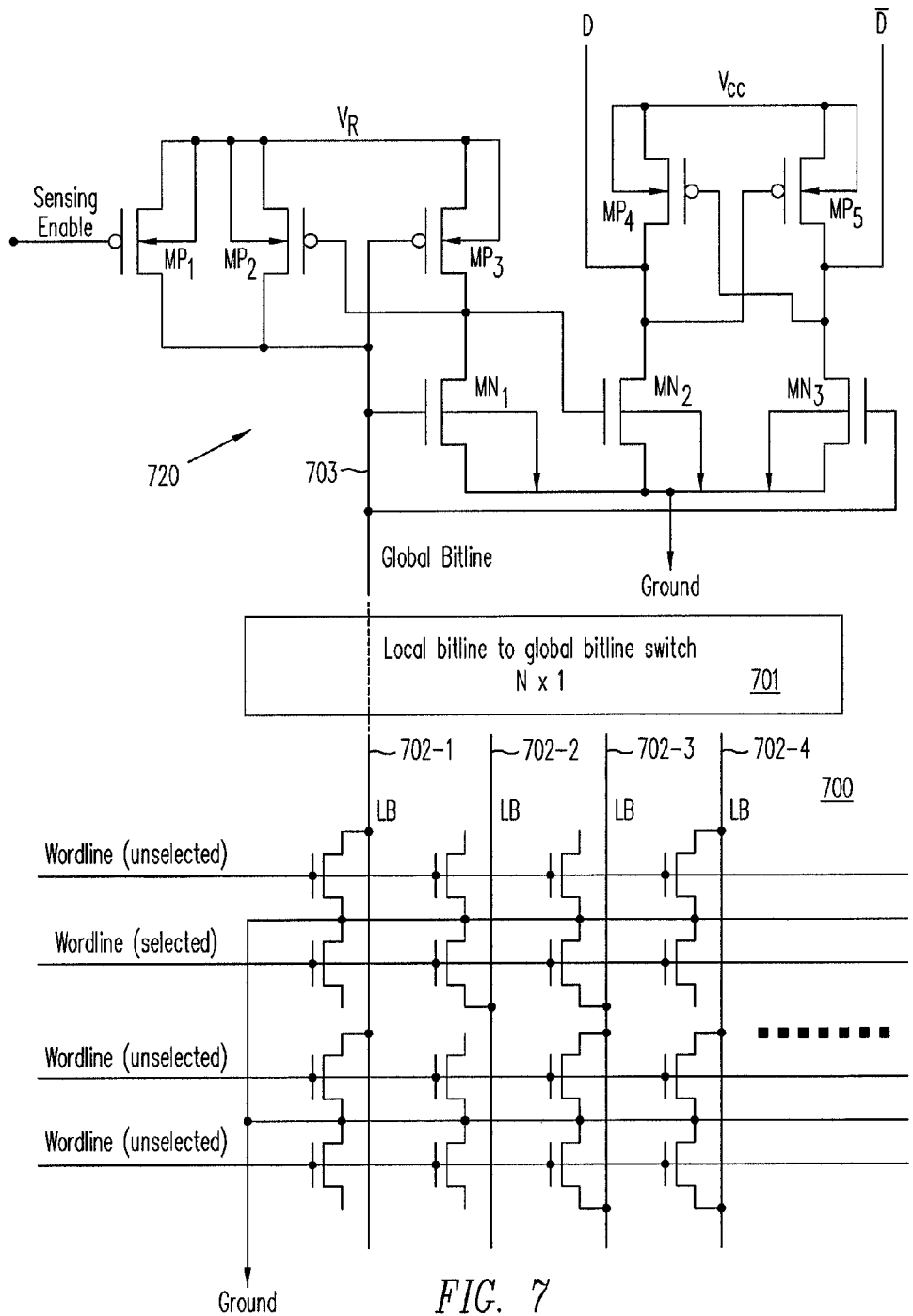
FIG. 7 shows circuit schematic for a NOR-type ROM array 700, in accordance with one embodiment of the present invention.

FIG. 7 shows circuit schematic for a NOR-type ROM array 700, in accordance with one embodiment of the present invention. As shown in FIG. 7, ROM array 700 includes an array of ROM cells, selected by word lines, each word line addressing a row of the ROM cells at a time. The state of each addressed ROM cell can be read at a corresponding one of local bit lines 702-1 to 702-N. Each ROM cell consists of a metal-semiconductor-oxide field effect transistor (MOSFET), which is either connected to the corresponding bit line or not connected to the corresponding bit line. Alternatively, connection of the MOSFET to the corresponding bit line may be controlled by a fuse which either connects the MOSFET to or keeps the MOSFET disconnected from the associated bit line. When the MOSFET is connected to its corresponding bit line, the voltage on its gate electrode renders the MOSFET conducting, thereby providing a discharge path from the bit line to the ground reference. Conversely, when the MOSFET is not connected to the bit line (i.e., a very high impedance path), the voltage $V_R$ on the bit line is not discharged. Switch structure 401 connects one of the local bit lines 701-1 to 701-N to a global bit line 703, which is read by readout circuit 720. Readout circuit 720 operates in substantially the same manner as read out circuit 200 discussed above.

Figure 8:
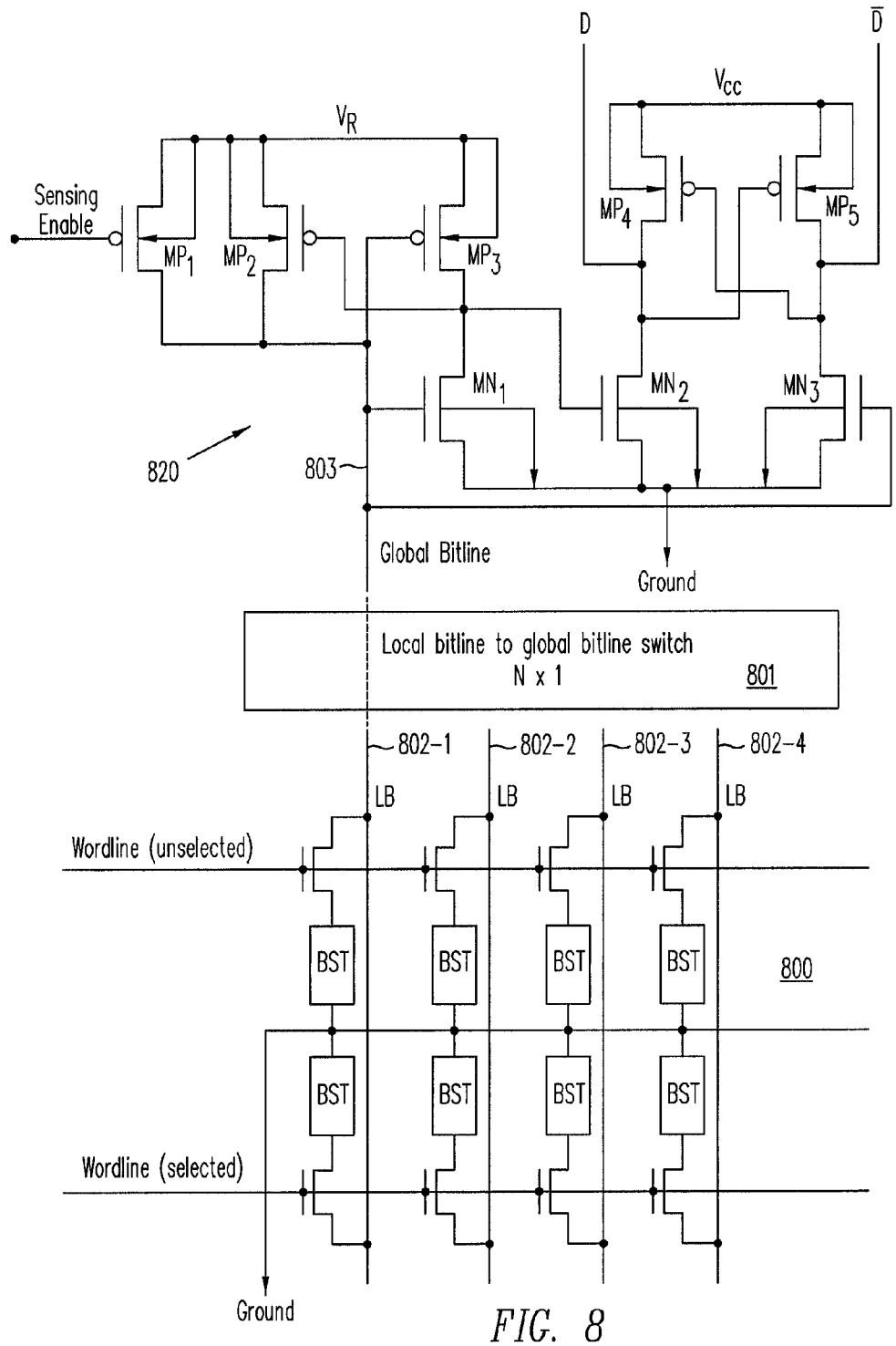
FIG. 8 shows circuit schematic for a phase change memory (PCM) array 700, in accordance with one embodiment of the present invention.

FIG. 8 shows circuit schematic for a phase change memory (PCM) array 800, in accordance with one embodiment of the present invention. As shown in FIG. 8, PCM array 800 includes an array of PCM cells, selected by word lines, each word line addressing a row of the PCM cells at a time. The state of each addressed PCM cell can be read at a corresponding one of local bit lines 802-1 to 802-N. In a PCM cell as shown in FIG. 8, a phase change material such as $Be_2Sb_2Te_5$ (BST) is connected to a bit line through an access MOSFET. During a data write step, an amorphous phase of the phase change material (i.e., the high resistance or low conductance state) is created by heating up the phase change material by passing a high electrical current, followed by rapid cooling. A polycrystalline phase (i.e., low resistance state or high conductance state) is created by a mild electrical current heating, followed by a slow cooling step. When the word line addresses a MOSFET, the MOSFET connects the bit line to the phase change material. Depending on the programmed state of the phase change material, the voltage $V_R$ on the bit line may discharge or may remain at voltage bias $V_R$. Switch structure 801 connects one of the local bit lines 801-1 to 801-N to a global bit line 803, which is read by readout circuit 820. Readout circuit 820 operates in substantially the same manner as read out circuit 200 discussed above.

Figure 9:
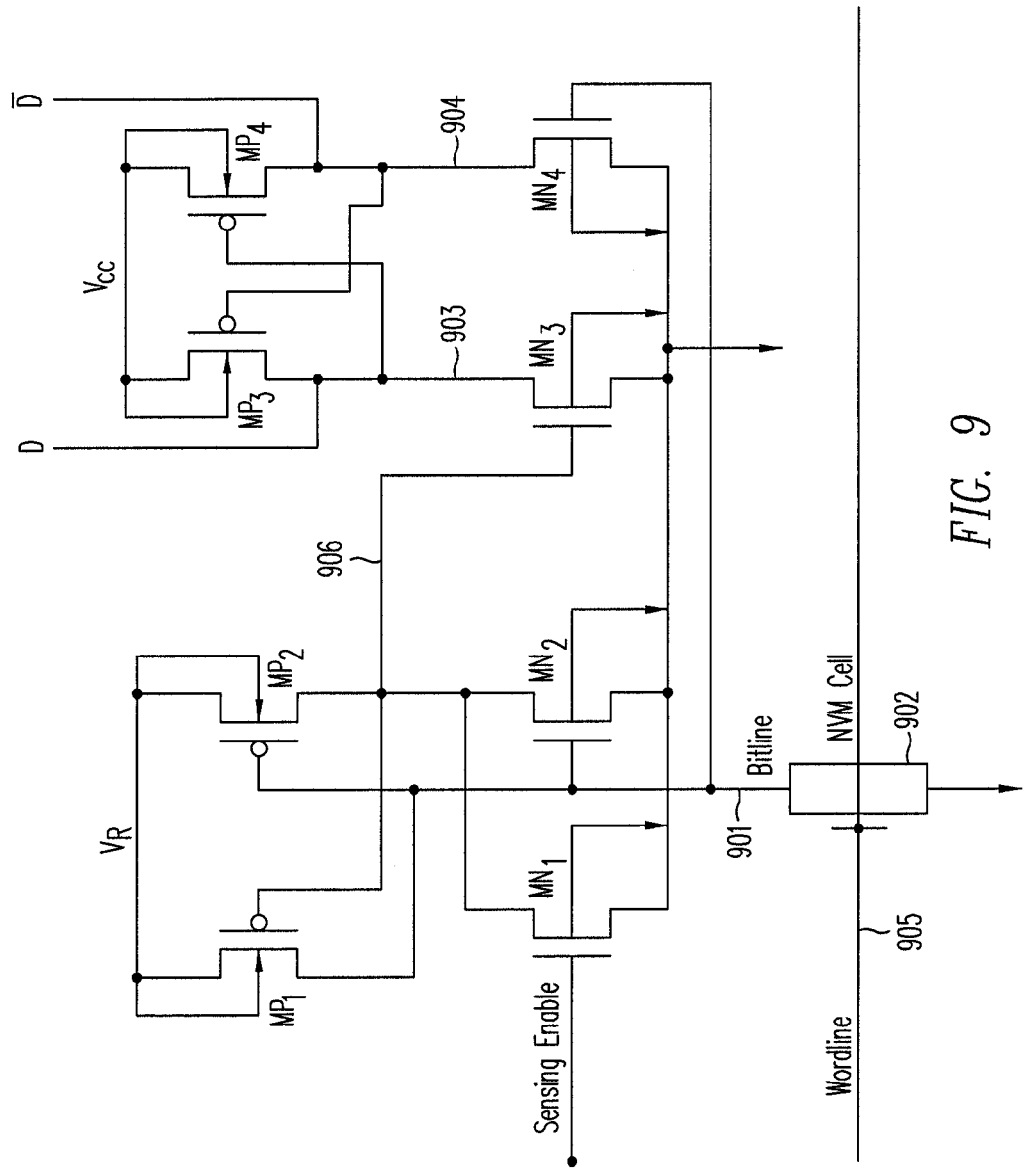
FIG. 9 shows readout circuit 900, in accordance with a second embodiment of the present invention.
Figure 10:
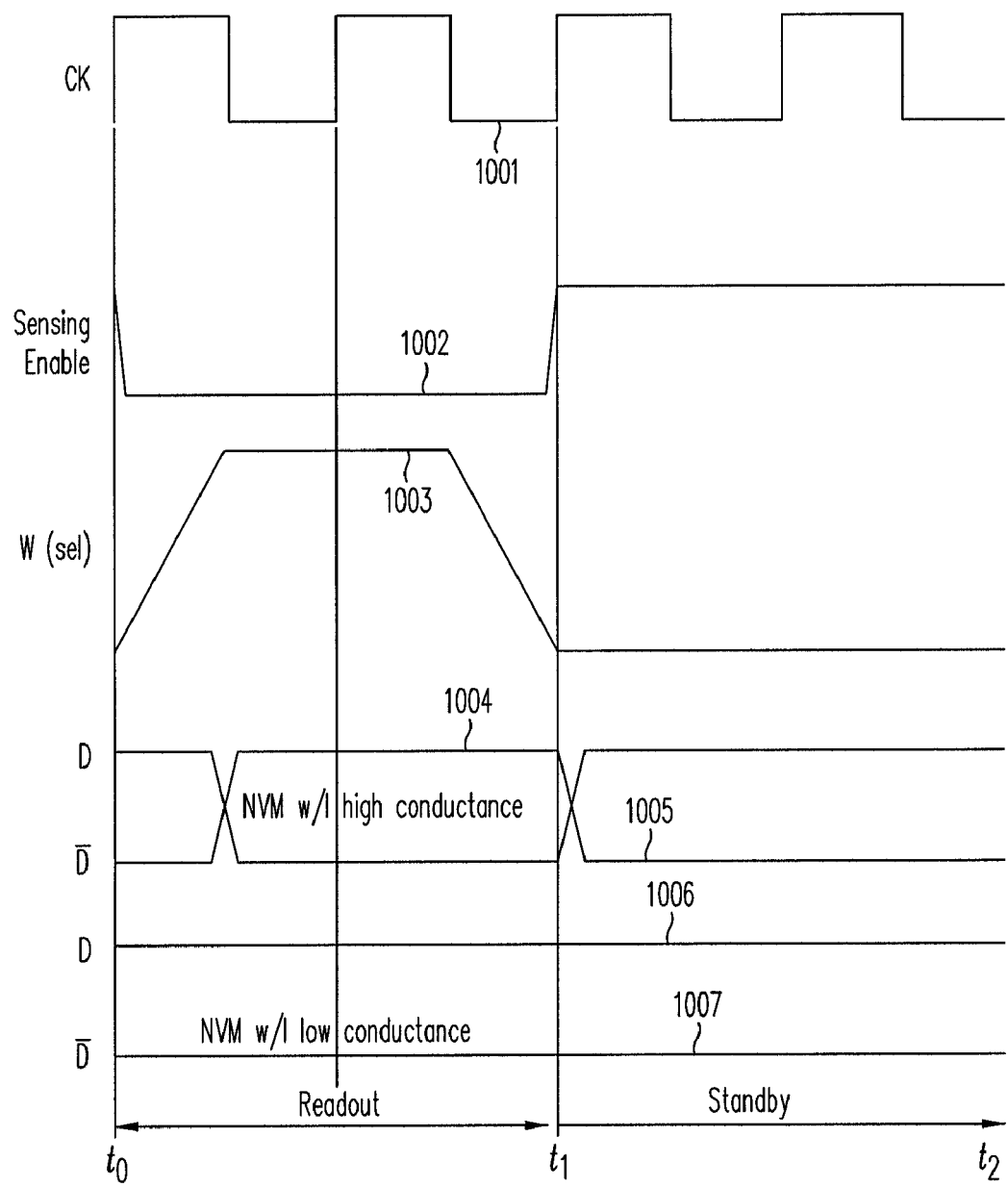
FIG. 10 illustrates the operations of readout circuitry 900 of FIG. 9, in accordance with one embodiment of the present invention.

FIG. 9 shows readout circuit 900, in accordance with a second embodiment of the present invention. FIG. 10 illustrates the operations of readout circuitry 900 of FIG. 9, in accordance with one embodiment of the present invention. In readout circuit 900 of FIG. 9, unlike in readout circuit 200, where "Sensing Enable" signal is asserted at the gate electrode of P-type MOSFET $MP_1$ to initiate a read operation, the asserted "Sensing Enable" is asserted at the gate electrode of N-type MOSFET $MN_1$ to initiate the read operation. As shown in FIG. 10, the "Sensing Enable" signal is asserted by pulling the gate electrode of MOSFET $MN_1$ to a "low" voltage (waveform 1002 for FIG. 10). Otherwise, at read out and standby operations, readout circuit 900 operates in substantially the same manner as read out circuit 200.

The above detailed description is provided to illustrate the specific embodiments of the present invention and is not intended to be limiting. Numerous modifications and variations within the scope of the present invention are possible. The present invention is set forth in the accompanying claims.

I claim:

1. A read circuit for sensing a conductance to ground in a bit line of a non-volatile memory cell, comprising:
    an input transistor receiving a binary input signal and providing, in response thereto, a control signal indicating a standby state and a sensing state;
    a charging transistor coupled to receive the control signal, the charging transistor charging the bit line to a bias voltage when the control signal is in the standby state and decoupling from the bit line when the control signal is in the sensing state;
    a current sensing circuit coupled to the bit line, wherein the current sensing circuit provides a current detection signal that changes state when a current flows to ground in the bit line greater than a predetermined value; and
    an output circuit having providing an output signal having a first state, when the bit line is charged, and changes to a second state when the current detection signal changes state.

2. A read circuit as in claim 1, wherein the input transistor comprises a PMOS transistor.

3. A read circuit as in claim 1, wherein the input transistor comprises an NMOS transistor.

4. A read circuit as in claim 1, wherein the current sensing circuit and the charging transistor exhibit a positive feedback effect which reinforces the decoupling of the charging transistor when a current flows in the bit line to ground.

5. A read circuit as in claim 1, wherein the current sensing circuit comprises a PMOS transistor and an NMOS transistor serially connected between the bias voltage and the ground reference, wherein the gate electrode of the PMOS transistor and the gate electrode of the NMOS transistors are connected in common with the bit line.

6. A read circuit as in claim 5, wherein the current detection signal is provided from a common terminal formed by the drain electrode of the PMOS transistor and the drain electrode of the NMOS transistor.

7. A read circuit as in claim 6, wherein the charging transistor is an MOS transistor and wherein the gate electrode of the charging transistor is coupled to the common terminal.

8. A read circuit as in claim 1, wherein the output circuit comprises a differential amplifier.

9. A read circuit as in claim 1, wherein the non-volatile memory cell comprises a EEPROM cell in a NAND-type EEPROM array.

10. A read circuit as in claim 1, wherein the non-volatile memory cell comprises a EEPROM cell in a NOR-type EEPROM array.

11. A read circuit as in claim 1, wherein the non-volatile memory cell comprises a read-only cell.

12. A read circuit as in claim 1, wherein the non-volatile memory cell comprises a phase change memory cell.

13. A method for sensing a conductance to ground in a bit line of a non-volatile memory cell, comprising:
    receiving a binary input signal and providing, in response thereto, a control signal indicating a standby state and a sensing state;
    charging the bit line to a bias voltage when the control signal is in the standby state and decoupling from the bit line when the control signal is in the sensing state;
    during the sensing state, sensing a current flowing to ground in the bit line and providing a current detection signal that changes state when the current in the bit line is greater than a predetermined value; and
    providing an output signal having a first state, when the bit line is charged during the standby state, and changes to a second state when the current detection signal changes state.

14. A method as in claim 13, wherein the binary signal is received into an input transistor, which comprises a PMOS transistor.

15. A method as in claim 13, wherein the binary signal is received into an input transistor, which comprises an NMOS transistor.

16. A method as in claim 13, wherein the current in the bit line is sensed in a sensing circuit, the bit line is being charged by a charging transistor, wherein the current sensing circuit and the charging transistor exhibit a positive feedback effect which reinforces the decoupling of the charging transistor when a current flows in the bit line to ground.

17. A method as in claim 16, wherein the current sensing circuit comprises a PMOS transistor and an NMOS transistor serially connected between the bias voltage and the ground reference, wherein the gate electrode of the PMOS transistor and the gate electrode of the NMOS transistors are connected in common with the bit line.

18. A method as in claim 17, wherein the current detection signal is provided from a common terminal formed by the drain electrode of the PMOS transistor and the drain electrode of the NMOS transistor.

19. A method as in claim 18, wherein the charging transistor is an MOS transistor and wherein the gate electrode of the charging transistor is coupled to the common terminal.

20. A method as in claim 13, wherein the output signal is provided from an output circuit, which comprises a differential amplifier.

21. A method as in claim 13, wherein the non-volatile memory cell comprises an EEPROM cell in a NAND-type EEPROM array.

22. A method as in claim 13, wherein the non-volatile memory cell comprises an EEPROM cell in a NOR-type EEPROM array.

23. A method as in claim 13, wherein the non-volatile memory cell comprises a read-only cell.

24. A method as in claim 13, wherein the non-volatile memory cell comprises a phase change memory cell.

* * * * *